United States Patent
Choi et al.

(10) Patent No.: US 7,265,054 B2
(45) Date of Patent: Sep. 4, 2007

(54) CHEMICAL MECHANICAL POLISHING METHOD FOR MANUFACTURING SEMICONDUCTOR DEVICE

(75) Inventors: Yong Soo Choi, Seongnam-si (KR); Won Mo Lee, Seoul (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 0 days.

(21) Appl. No.: 11/268,961

(22) Filed: Nov. 8, 2005

(65) Prior Publication Data
US 2006/0223319 A1   Oct. 5, 2006

(30) Foreign Application Priority Data
Apr. 4, 2005   (KR) ............... 10-2005-0028293

(51) Int. Cl.
*H01L 21/461* (2006.01)
*H01L 21/302* (2006.01)

(52) U.S. Cl. ............. 438/690; 438/691; 438/692; 438/693

(58) Field of Classification Search ............ None
See application file for complete search history.

(56) References Cited

U.S. PATENT DOCUMENTS

| 5,314,843 A | * | 5/1994 | Yu et al. ............... 438/692 |
| 5,789,290 A | | 8/1998 | Sun ............... 438/253 |
| 5,872,045 A | * | 2/1999 | Lou et al. ............... 438/432 |
| 6,191,039 B1 | | 2/2001 | Chang et al. ............... 438/692 |
| 6,284,660 B1 | * | 9/2001 | Doan ............... 438/692 |
| 6,319,836 B1 | * | 11/2001 | Dunton et al. ............... 438/691 |
| 6,350,693 B2 | | 2/2002 | Chang et al. ............... 438/692 |

FOREIGN PATENT DOCUMENTS

KR   10-2002-0013373   2/2002

* cited by examiner

*Primary Examiner*—Duy-Vu N. Deo
(74) *Attorney, Agent, or Firm*—Marshall, Gerstein & Borun LLP

(57) ABSTRACT

Disclosed herein is a chemical mechanical polishing (CMP) method for manufacturing a semiconductor device, comprising performing partial ion implantation of dopants at different concentrations into a plurality of at least two divided regions of a wafer having a planarization-target film, and subjecting the partially ion implanted-wafer to a chemical mechanical polishing process. In accordance with the present invention, non-uniformity of the removal rate in a chemical mechanical polishing process is countervailed by dopants which are implanted at different concentrations via partial ion implantation, and thereby it is possible to polish the target film at a uniform removal rate.

4 Claims, 11 Drawing Sheets
(1 of 11 Drawing Sheet(s) Filed in Color)

| Crystal direction | Conductive dopant | Doping conc. ($cm^{-3}$) | Removal rate ($\mu m/h$) |
|---|---|---|---|
| (100) | n, phosphorus | $5 \cdot 10^{14} - 5 \cdot 10^{15}$ | 15.8 |
| (100) | p, boron | $1.1 \cdot 10^{15} - 1.6 \cdot 10^{15}$ | 15.3 |
| (100) | $p^+$, boron | $3.1 \cdot 10^{19}$ | 8.8 |
| (111) | n, phosphorus | $1.4 \cdot 10^{13} - 1.9 \cdot 10^{13}$ | 9.8 |
| (111) | n, antimony | $5.2 \cdot 10^{17}$ | 10.3 |

CHEMICAL MECHANICAL POLISHING METHOD FOR MANUFACTURING SEMICONDUCTOR DEVICE

BACKGROUND OF THE INVENTION

1. Field of the Invention

The present invention relates to a method for manufacturing a semiconductor device, and more particularly to a chemical mechanical polishing method for manufacturing a semiconductor device.

2. Description of the Related Art

Recently, with the increased degree of integration of semiconductor devices and introduction of various materials, the importance of planarization processes has increased. Among such processes, mechanical polishing results in the formation of deformed layers, causing product defects, while chemical polishing does not cause the formation of such deformed layers, it has a limitation in that precise flatness cannot be achieved. As such, chemical mechanical polishing (CMP) is primarily employed which has the advantages of both chemical and mechanical polishing methods.

In such a chemical mechanical polishing method, a wafer having a polishing-target film is polished by a pad and slurry. A polishing table, to which the pad is attached, is rotated, while a head part of the polishing table simultaneously rotates and fluctuates and applies given pressure to a wafer. The wafer is mounted on the head part of the polishing table by surface tension or a vacuum. Self-load of the head part and pressure applied thereto results in contact between the pad and wafer surface, and slurry flows through minute interstices defined between interfaces thereof, i.e., pores of the pad. Consequently, mechanical removing action is effected by slurry-constituting polishing particles and surface protrusions of the pad and at the same time, chemical removal is also affected by chemical components in the slurry.

Upon performing a planarization process via use of chemical mechanical polishing, a removal rate, which refers to the ratio of film material to be removed, is unfortunately non-uniform depending upon changes in the position of wafer. For example, when the wafer is planarized by removing a polysilicon film to a predetermined thickness or the planarization process of the wafer is performed until the film materials beneath the polysilicon film are exposed, the removal rate of polysilicon film varies depending upon the position of wafer. As a result, over-polishing beyond a conventional removal amount is caused and thereby a great deal of problems may occur in subsequent processes.

Figure 1:
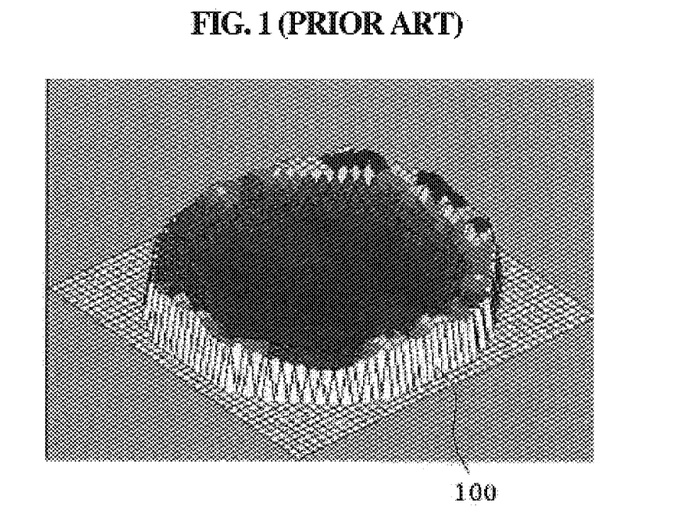
FIG. 1 is a view illustrating distribution of a removal amount of a polishing-target film with respect to the position of a wafer, in a general chemical mechanical polishing method.

FIG. 1 is a view illustrating distribution of a removal amount of a polishing-target film with respect to the position of a wafer, in a general chemical mechanical polishing method.

As shown in FIG. 1, when comparing respective removal amounts at a central part and edge of a wafer 100 after a chemical mechanical polishing process was carried out on the polysilicon film, it can be seen that the removal rate at the edge of the wafer 100 is higher than at the central part of the wafer 100. That is, the rate at which the polysilicon film is removed at the edge of the wafer 100 is higher than the rate at which the polysilicon film is removed at the central part of the wafer 100. Consequently, over-polishing occurs at the edge of the wafer 100, or insufficient polishing is put into effect at the central part of the wafer 100.

Figure 2:
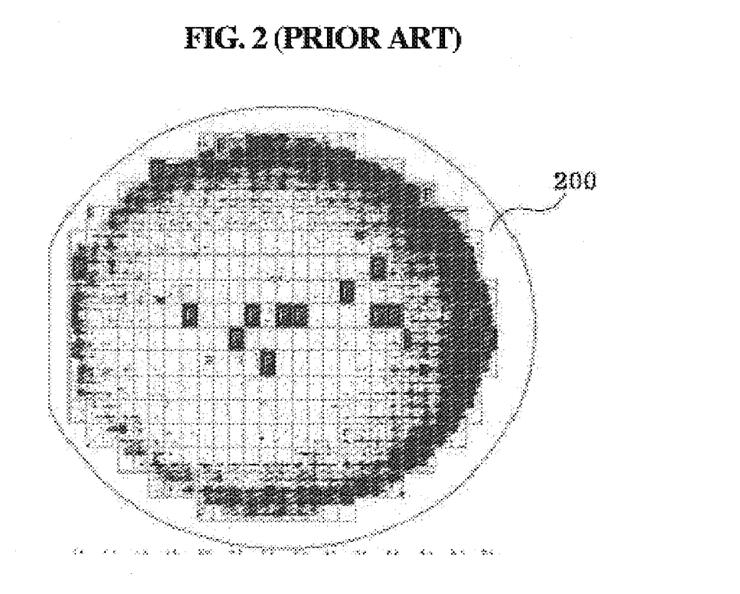
FIG. 2 is a view showing the state distribution of chips in a wafer to which a conventional chemical mechanical polishing method is applied.

FIG. 2 is a view showing state distribution of chips in a wafer to which a conventional chemical mechanical polishing method is applied.

As shown in FIG. 2, according to an image obtained from examination of the wafer to which the conventional chemical mechanical polishing method was applied, a central part of a wafer 200 is bright, while the edge of the wafer 200 is dark. These results denote a high probability of occurrence of defective chips at the edge of the wafer 200. One of causes responsible for the occurrence of such defective chips is non-uniformity of the target film removal rate in a chemical mechanical polishing process. As such, it is readily seen that the total yield of products may be reduced due to the non-uniform removal rate exhibited by the conventional chemical mechanical polishing method.

SUMMARY OF THE INVENTION

Therefore, the present invention has been made in view of the above problems, and it is an object of the present invention to provide a chemical mechanical polishing method for manufacturing a semiconductor device, by rendering the removal rate for the planarization-target film uniform throughout the wafer, such that the occurrence of process defects in subsequent processes is inhibited and the yield is increased.

In accordance with the present invention, the above and other objects can be accomplished by the provision of a chemical mechanical polishing method for manufacturing a semiconductor device, comprising:

performing partial ion implantation of dopants at different concentrations into a plurality of at least two divided regions of a wafer having a planarization-target film; and subjecting the partially ion implanted-wafer to a chemical mechanical polishing process.

Preferably, the target film may be a polysilicon film.

Preferably, the dopants may be boron ions.

The partial ion implantation step is preferably carried out in a manner that a relatively high concentration of boron ions is implanted into the region having a high removal rate of the target film, so as to decrease the removal rate, and a relatively low concentration of boron ions is implanted into the region having a low removal rate of the target film, so as to increase the removal rate.

Implantation of boron ions is preferably carried out within the concentration of $1 \times 10^{11}$ to $5 \times 10^{15}$ ions/cm$^2$ and within the implantation energy of 10 KeV to 500 KeV.

The partial ion implantation step may include analyzing distribution of a removal rate of the target film by the chemical mechanical polishing process in the wafer; establishing a plurality of at least two regions of a wafer divided according to distribution of the removal rate, based on the analysis results; and performing partial ion implantation to implant different concentrations of dopants into each of the established plural regions.

BRIEF DESCRIPTION OF THE DRAWINGS

The patent file contains two drawings executed in color. Copies of this patent with color drawings will be provided by the Office upon request and payment of the necessary fee.

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described more fully with reference to the accompanying drawings hereinafter, in which preferred embodiments of the invention are shown. This invention may, however, be embodied in different forms and should not be construed as limited to the embodiments set forth herein.

Figure 3:
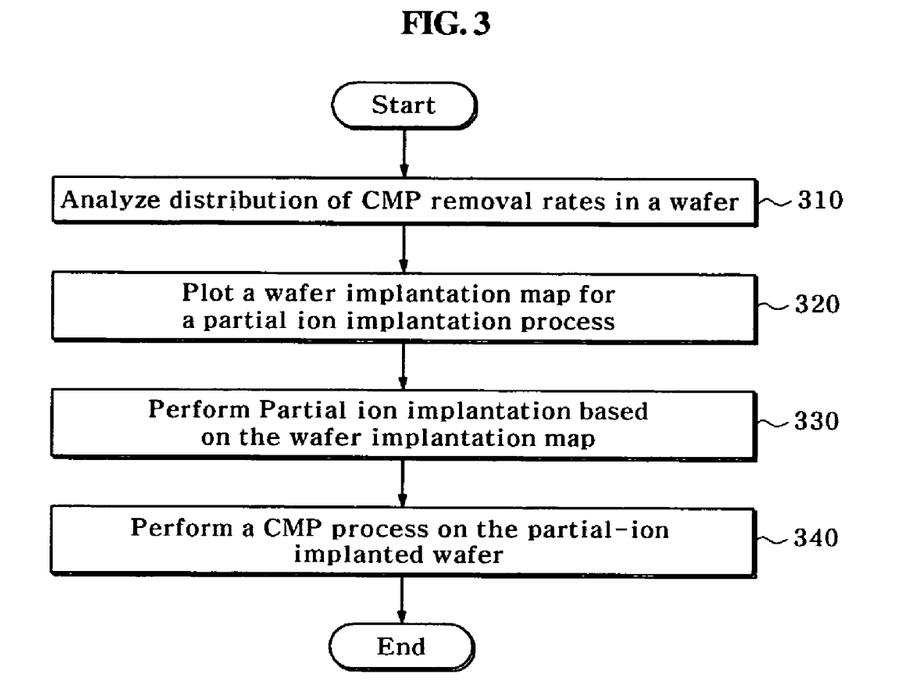
FIG. 3 is a flow chart illustrating a chemical mechanical polishing method in accordance with the present invention.

FIG. 3 is a flow chart illustrating a chemical mechanical polishing method for manufacturing a semiconductor device in accordance with the present invention.

Referring now to FIG. 3, distribution of a removal rate of the target film with respect to a chemical mechanical polishing of the wafer is first analyzed (Step 310). This step may be carried out using a test wafer. Next, a wafer implantation map is plotted for the partial ion implantation as a subsequent process (Step 320). Herein, the partial ion implantation process refers to a process involving dividing the wafer into at least two regions and performing ion implantation such that the respective regions are doped with different concentrations of dopants. Therefore, the wafer implantation map means a map in which the wafer is divided into at least two regions according to the removal rate of the target film.

Next, based on the wafer implantation map thus prepared, the partial ion implantation process is carried out (Step 330). That is, dopants are implanted into plural regions divided in the wafer implantation map, while dopants are to be implanted at different concentrations into the respective regions. Herein, the concentration of dopants to be implanted is determined depending upon the removal rate of the target film. Specifically, a removal rate-decreasing concentration of dopants is implanted into the region having a high removal rate of the target film, while a removal rate-increasing concentration of dopants is implanted into the region having a low removal rate of the target film.

When the target film is a polysilicon film, boron (B) ions are used as dopants. In this case, partial ion implantation is carried out in a manner where a relatively high concentration of boron ions is implanted into the region having a high removal rate of the polysilicon film, so as to decrease the removal rate, while a relatively low concentration of boron ions is implanted into the region having a low removal rate of the polysilicon film, so as to increase the removal rate. Implantation of boron ions is preferably carried out within the concentration of about $1\times10^{11}$ to $5\times10^{15}$ ions/cm$^2$ and within the implantation energy of 10 KeV to 500 KeV.

After such partial ion implantation of dopants, a chemical mechanical polishing process is carried out on the wafer (Step 340). The chemical mechanical polishing process may be carried out via use of conventional methods known in the art. As dopants are implanted at different concentrations according to the removal rate of the target film, the target film is removed at a relatively lower removal rate in the high-removal rate region, while the target film is removed at a relatively higher removal rate in the low-removal rate region, during the chemical mechanical polishing process. As a result, it is possible to remove the target film at a uniform removal rate throughout the wafer.

Figure 4:
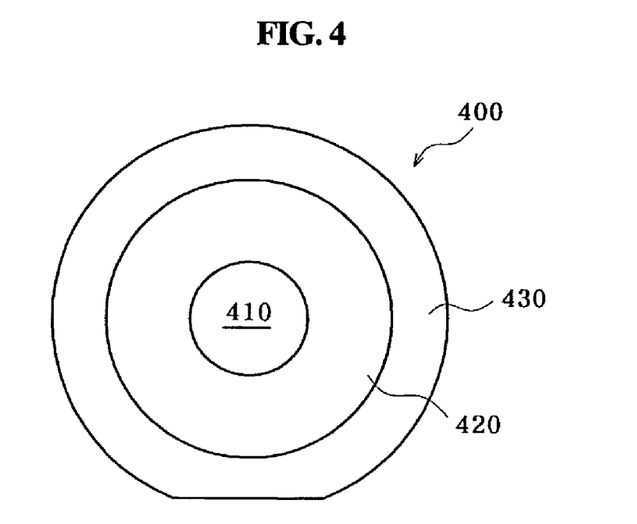
FIG. 4 is a plan view illustrating a partial ion implantation step in a flow chart of FIG. 3.

FIG. 4 is a plan view illustrating a partial ion implantation step in a flow chart of FIG. 3

Referring now to FIG. 4, a wafer implantation map is exemplified wherein a wafer 400 is divided into three regions according to the removal rate of target film via chemical mechanical planarization, by performing Steps 310 and 320 of FIG. 3. In addition, there is exemplified the case in which the target film to be planarized is a polysilicon film. In this case, a first region 410, which is the central part of the wafer 400, exhibits the lowest removal rate, a third region 430, which is the edge of the wafer 400, exhibits the highest removal rate, and a second region 420, which is the middle part of the wafer 400, exhibits a removal rate higher than the first region 410, and lower than the third region 430. In performing the partial ion implantation process based on such a wafer implantation map, where boron (B) ions are employed as implantation dopants, a concentration of boron (B) ions in the first region 410 is set to the least such that the removal rate of the polysilicon film in the first region 410 is increased. A concentration of boron (B) ions in the third region 430 is set to the highest level such that the removal rate of the polysilicon film in the third region 430 is decreased. In addition, a concentration of boron (B) ions in the second region 420 is set to a concentration higher than the first region 410 and lower than the third region 430. According to such partial ion implantation, it is possible to achieve uniform removal rates of the polysilicon film in the first region 410, the second region 420 and the third region 430.

Figure 5A:
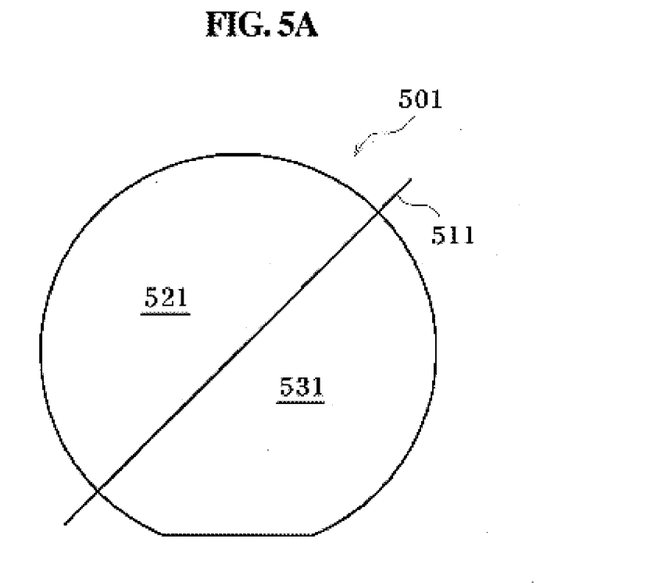
FIGS. 5a and 5b are views illustrating one embodiment of a partial ion implantation step in a flow chart of FIG. 3.
Figure 5B:
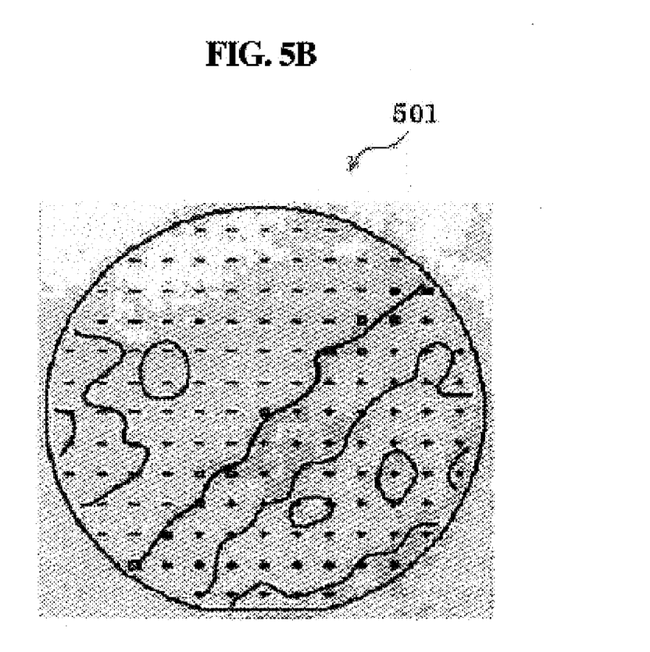

FIGS. 5a and 5b are views illustrating one embodiment of a partial ion implantation step in a flow chart of FIG. 3.

Referring to FIG. 5a, bit lines are formed in cell regions of a wafer 501 and ion implantation for control of n-channel threshold voltage is carried out in peripheral circuit regions. Generally, BF$_2$ ions are implanted at an implantation energy of 20 KeV and an implantation concentration of $2.5\times10^{12}$ ions/cm$^2$. However, according to a partial ion implantation step in a chemical mechanical polishing method of the present invention, different concentrations of BF$_2$ ions are implanted to a first region 521 and second region 531, divided by a boundary line 511 according to the prepared wafer implantation map. That is, the first region 521 is implanted with BF$_2$ ions at an implantation energy of 20 KeV, an implantation concentration of 2.5×10$^{12}$ ions/cm$^2$ and an implantation angle of 7 or 22 degrees, while the second region 531 is implanted with BF$_2$ ions at an implantation energy of 20 KeV, an implantation concentration of 2.8×10$^{12}$ ions/cm$^2$ and an implantation angle of 7 or 22 degrees.

Reviewing results obtained from such partial ion implantation, as shown in FIG. 5b, the concentration of BF$_2$ ions in the second region 531 is relatively high, the concentration of BF$_2$ ions in the first region 521 is relatively low, and the concentration of BF$_2$ ions around the boundary between the first and second regions is medium. In FIG. 5b, "+" means that the concentration of BF$_2$ ions is relatively high, "−" means that the concentration of BF$_2$ ions is relatively low, and "□" means that the concentration of BF$_2$ ions is medium. Therefore, when the chemical mechanical polishing process, which is a subsequent process, is carried out under such conditions, the removal rate in the second region 531 is relatively lower and thereby a uniform removal rate can be achieved throughout the wafer.

Figure 6A:
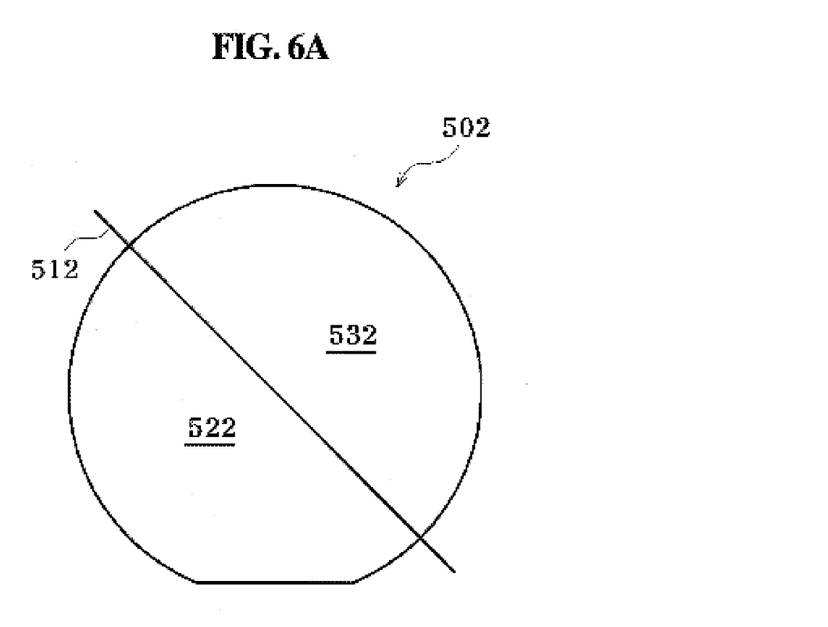
FIGS. 6a and 6b are views illustrating another embodiment of a partial ion implantation step in a flow chart of FIG. 3.
Figure 6B:
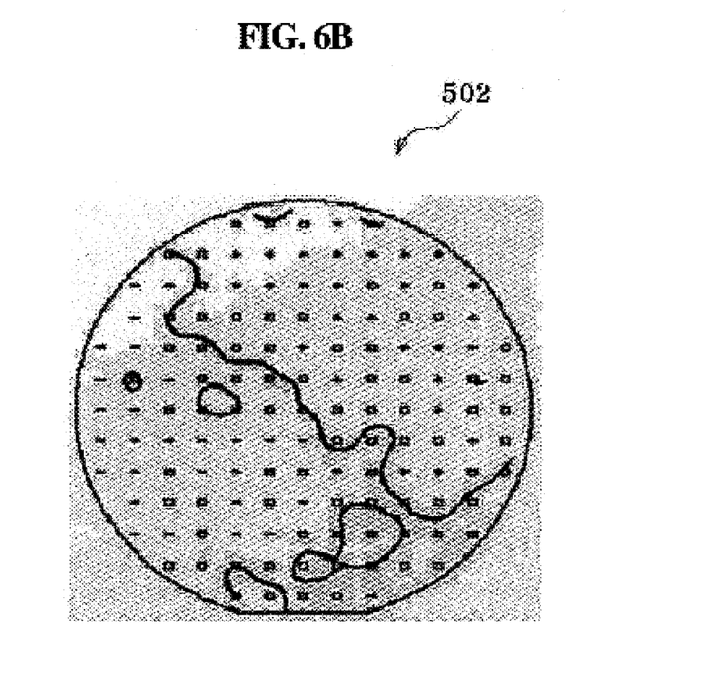

FIGS. 6a and 6b are views illustrating another embodiment of a partial ion implantation step in a flow chart of FIG. 3.

First, referring to FIG. 6a, bit lines are formed in cell regions of a wafer 502 and ion implantation for control of p-channel threshold voltage is carried out in peripheral circuit regions. Generally, BF$_2$ ions are implanted at an implantation energy of 20 KeV and an implantation concentration of 7.5×10$^{12}$ ions/cm$^2$. However, according to a partial ion implantation step in a chemical mechanical polishing method of the present invention, different concentrations of BF$_2$ ions are implanted to a first region 522 and second region 532, divided by a boundary line 512 according to the prepared wafer implantation map. That is, the first region 522 is implanted with BF$_2$ ions at an implantation energy of 20 KeV, an implantation concentration of 7.5×10$^{12}$ ions/cm$^2$ and an implantation angle of 7 or 22 degrees, while the second region 533 is implanted with BF$_2$ ions at an implantation energy of 20 KeV, an implantation concentration of 7.65×10$^{12}$ ions/cm$^2$ and an implantation angle of 7 or 22 degrees.

Reviewing results obtained from such partial ion implantation, as shown in FIG. 6b, the concentration of BF$_2$ ions in the second region 532 is relatively high, the concentration of BF$_2$ ions in the first region 522 is relatively low, and the concentration of BF$_2$ ions around the boundary between the first and second regions is medium. Similarly, in FIG. 6b, "+" means that the concentration of BF$_2$ ions is relatively high, "−" means that the concentration of BF$_2$ ions is relatively low, and "□" means that the concentration of BF$_2$ ions is medium. Similarly, when the chemical mechanical polishing process, which is a subsequent process, is carried out, the removal rate in the second region 532 is relatively lowered and thereby a uniform removal rate can be achieved throughout the wafer.

Figure 7A:
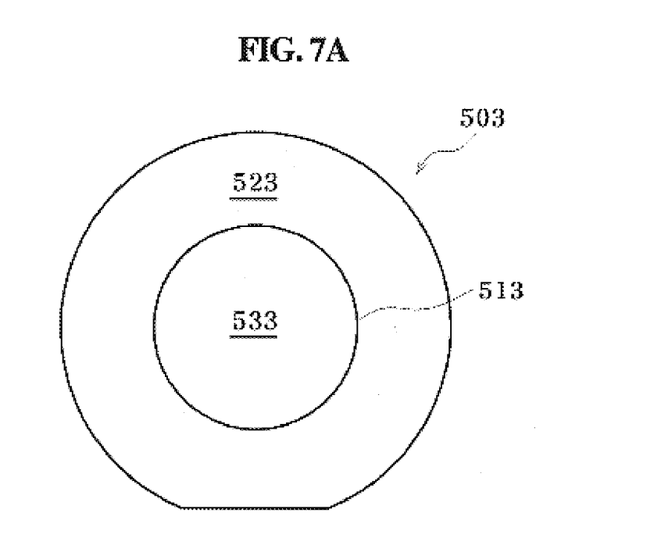
FIGS. 7a and 7b are views illustrating a further embodiment of a partial ion implantation step in a flow chart of FIG. 3.
Figure 7B:
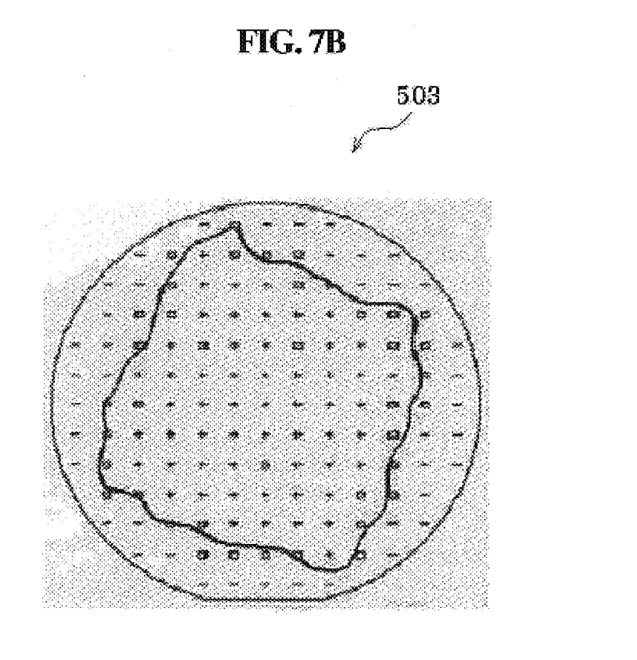

FIGS. 7a and 7b are views illustrating a further embodiment of a partial ion implantation step in a flow chart of FIG. 3.

First, referring to FIG. 7a, bit lines are formed in cell regions of a wafer 503 and ion implantation for an n-channel MOS transistor is carried out in peripheral circuit regions. Generally, phosphorus (P) ions are implanted at an implantation energy of 25 KeV and an implantation concentration of 1.0×10$^{13}$ ions/cm$^2$. However, according to a partial ion implantation step in a chemical mechanical polishing method of the present invention, different concentrations of phosphorus (P) ions are implanted to a first region 523 and second region 533, divided by a boundary line 513 according to the prepared wafer implantation map. In this embodiment, the boundary line 513 takes a circular shape, and thereby the first region 523 is an edge region of a wafer 503 and the second region 533 is a central part of the wafer 503. Specifically, the first region 523 is implanted with phosphorus (P) ions at an implantation energy of 25 KeV, an implantation concentration of 1.0×10$^{13}$ ions/cm$^2$ and an implantation angle of 0 or 22 degrees, while the second region 533 is implanted with phosphorus (P) ions at an implantation energy of 25 KeV, an implantation concentration of 1.1×10$^{13}$ ions/cm$^2$ and an implantation angle of 0 or 22 degrees.

Reviewing results obtained from such partial ion implantation, as shown in FIG. 7b, the concentration of phosphorus ions in the second region 533 is relatively high, the concentration of phosphorus ions in the first region 523 is relatively low, and the concentration of phosphorus (P) ions around the boundary between the first and second regions is medium. Similarly, in FIG. 7b, "+" means that the concentration of phosphorus ions is relatively high, "−" means that the concentration of phosphorus ions is relatively low, and "□" means that the concentration of phosphorus ions is medium. Such partial ion implantation can be applied to the case in which the removal rate of the target film is higher in the central part of the wafer. Therefore, when the chemical mechanical polishing process, which is a subsequent process, is carried out under such conditions, the removal rate in the second region 533 is lowered and thereby a uniform removal rate can be achieved throughout the wafer.

Figure 8A:
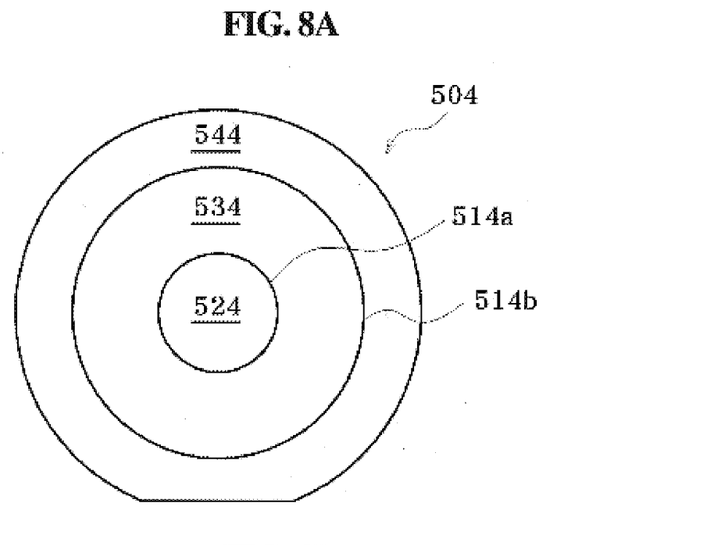
FIGS. 8a and 8b are views illustrating yet another embodiment of a partial ion implantation step in a flow chart of FIG. 3.
Figure 8B:
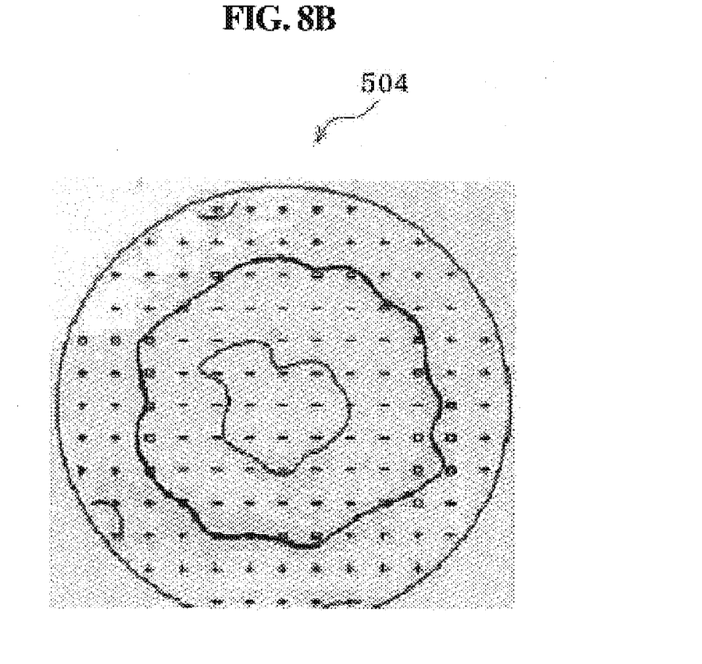

FIGS. 8a and 8b are views illustrating yet another embodiment of a partial ion implantation step in a flow chart of FIG. 3.

First, referring to FIG. 8a, bit lines are formed in cell regions of a wafer 504 and ion implantation for control of p-channel threshold voltage is carried out in peripheral circuit regions. Generally, BF$_2$ ions are implanted at an implantation energy of 20 KeV and an implantation concentration of 1.6×10$^{13}$ ions/cm$^2$. However, according to a partial ion implantation step in a chemical mechanical polishing method of the present invention, different concentrations of BF$_2$ ions are implanted to a first region 524, second region 534 and third region 544, divided by a first boundary line 514a and a second boundary line 514b according to the prepared wafer implantation map. Similarly, in this embodiment, the first and secondary boundary lines 514a and 514b also take circular shapes, as previously described with reference to FIGS. 7a and 7b, but there is a difference in that the wafer is divided into 3 regions. In this embodiment, the first region 524 is the central part of the wafer 504, the third region 544 is the edge part of the wafer 504, and the second region 534 is a part defined between the first region 524 and third region 544. Specifically, the first region 524 is implanted with BF$_2$ ions at an implantation energy of 20 KeV, an implantation concentration of 1.55×10$^{13}$ ions/cm$^2$ and an implantation angle of 0 or 112 degrees, the second region 534 is implanted with BF$_2$ ions at an implantation energy of 20 KeV, an implantation concentration of 1.6×10$^{13}$ ions/cm$^2$ and an implantation angle of 0 or 112 degrees, and the third region 544 is implanted with BF$_2$ ions at an implantation energy of 20 KeV, an implantation concentration of $1.65 \times 10^{13}$ ions/cm$^2$ and an implantation angle of 0 or 112 degrees.

Reviewing results obtained from such partial ion implantation, as shown in FIG. 8b, the concentration of BF$_2$ ions in the third region 544 is relatively high, and the concentrations of BF$_2$ ions in the first region 524 and second region 534 are relatively low. Similarly, in FIG. 8b, "+" means that the concentration of BF$_2$ ions is relatively high, "−" means that the concentration of BF$_2$ ions is relatively low, and "□" means that the concentration of BF$_2$ ions is medium. Such partial ion implantation can be applied to the case in which the removal rate of the target film is higher at the edge part of the wafer. Therefore, when the chemical mechanical polishing process, which is a subsequent process, is carried out under such conditions, the degree to which the removal rate is lowered in the second region 534 and third region 544 is greater than the degree to which the removal rate is lowered in the first region 524, thereby achieving a uniform removal rate throughout the wafer.

Figure 9A:
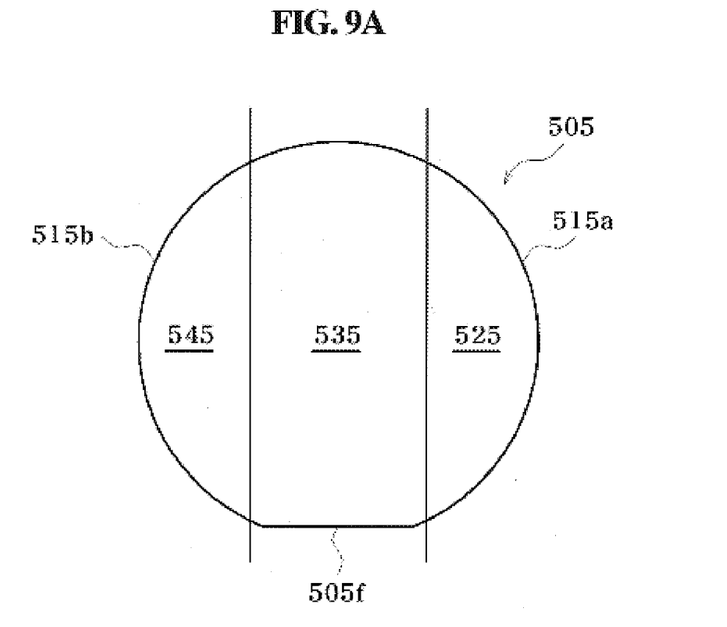
FIGS. 9a and 9b are views illustrating a still further embodiment of a partial ion implantation step in a flow chart of FIG. 3.
Figure 9B:
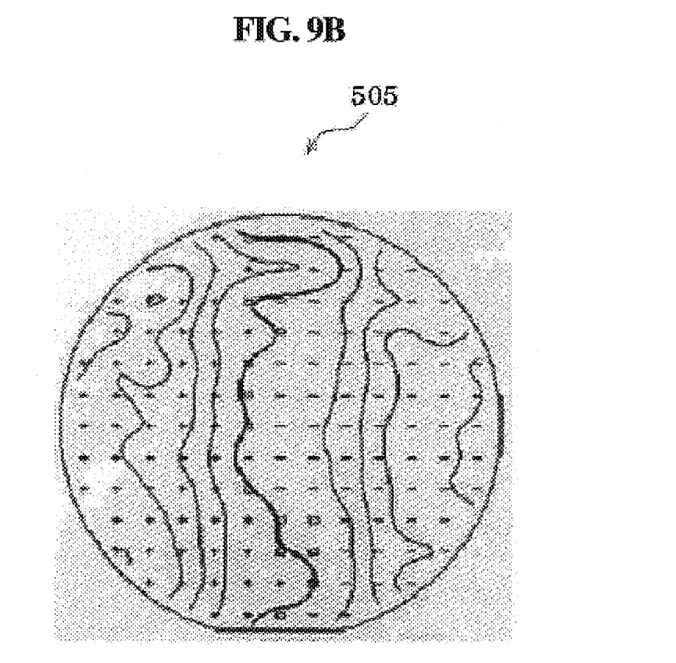

FIGS. 9a and 9b are views illustrating a still further embodiment of a partial ion implantation step in a flow chart of FIG. 3.

First, referring to FIG. 9a, bit lines are formed in cell regions of a wafer 505 and ion implantation for formation of a halo region is carried out in peripheral circuit regions. Generally, BF$_2$ ions are implanted at an implantation energy of 50 KeV and an implantation concentration of $3.5 \times 10^{13}$ ions/cm$^2$. However, according to a partial ion implantation step in a chemical mechanical polishing method of the present invention, different concentrations of BF$_2$ ions are implanted to a first region 525, second region 535 and third region 545, divided by a first boundary line 515a and a second boundary line 515b according to the prepared wafer implantation map. In this embodiment, the first boundary line 515a and second boundary line 515b are arranged in a vertical direction under the condition where a flat zone 505f of the wafer 505 is positioned at a lower part thereof. Accordingly, the first region 525 is the right part of the wafer 505, the second region 535 is the middle part of the wafer 505 and the third region 545 is the left part of the wafer 505. Specifically, the first region 525 is implanted with BF$_2$ ions at an implantation energy of 50 KeV, an implantation concentration of $3.3 \times 10^{13}$ ions/cm$^2$ and an implantation angle of 0 or 22 degrees, the second region 535 is implanted with BF$_2$ ions at an implantation energy of 50 KeV, an implantation concentration of $3.5 \times 10^{13}$ ions/cm$^2$ and an implantation angle of 0 or 22 degrees, and the third region 545 is implanted with BF$_2$ ions at an implantation energy of 50 KeV, an implantation concentration of $3.7 \times 10^{13}$ ions/cm$^2$ and an implantation angle of 0 or 22 degrees.

Reviewing results obtained from such partial ion implantation, as shown in FIG. 9b, the concentration of BF$_2$ ions in the third region 545 is relatively high, and the concentrations of BF$_2$ ions in the first region 525 and second region 535 are relatively low. Similarly, in FIG. 9b, "+" means that the concentration of BF$_2$ ions is relatively high, "−" means that the concentration of BF$_2$ ions is relatively low, and "□" means that the concentration of BF$_2$ ions is medium. Such partial ion implantation can be applied to the case in which the removal rate of the target film is higher in the left part of the wafer. Therefore, when the chemical mechanical polishing process, which is a subsequent process, is carried out under such conditions, the degree to which the removal rate is lowered in the third region 545 is greater than the degree to which the removal rate is lowered in the first region 525 and the second region 535, thereby achieving a uniform removal rate throughout the wafer.

Figure 10A:
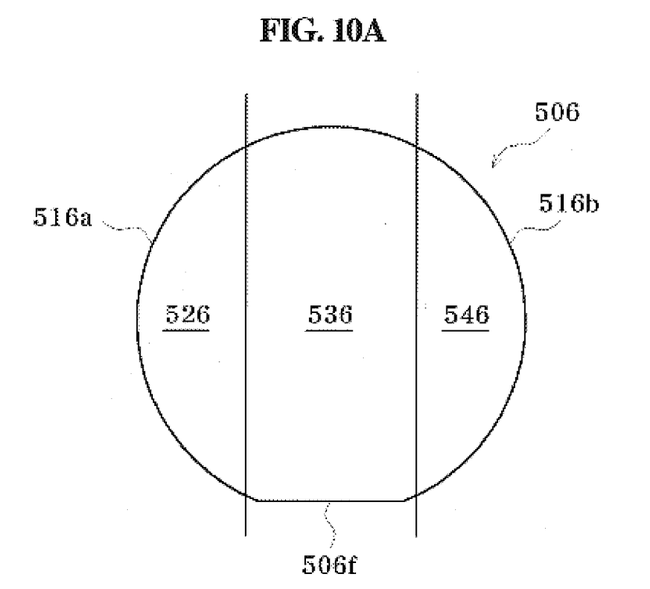
FIGS. 10a and 10b are views illustrating a further embodiment of a partial ion implantation step in a flow chart of FIG. 3.
Figure 10B:
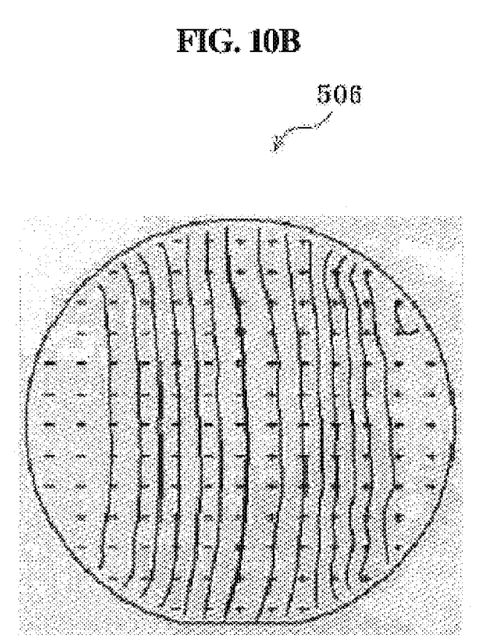

FIGS. 10a and 10b are views illustrating a further embodiment of a partial ion implantation step in a flow chart of FIG. 3.

First, referring to FIG. 10a, bit lines are formed in cell regions of a wafer 506 and ion implantation for an n-channel type MOS transistor is carried out in peripheral circuit regions. Generally, arsenic (As) ions are implanted at an implantation energy of 20 KeV and an implantation concentration of $3.2 \times 10^{13}$ ions/cm$^2$. However, according to a partial ion implantation step in a chemical mechanical polishing method of the present invention, different concentrations of arsenic (As) ions are implanted to a first region 526, second region 536 and third region 546, divided by a first boundary line 516a and a second boundary line 516b according to the prepared wafer implantation map. In this embodiment, the first boundary line 516a and second boundary line 516b are arranged in a vertical direction under the condition where a flat zone 506f of the wafer 506 is positioned at a lower part thereof. Accordingly, the first region 526 is the left part of the wafer 506, the second region 536 is the middle part of the wafer 506 and the third region 546 is the right part of the wafer 506. Specifically, the first region 526 is implanted with arsenic (As) ions at an implantation energy of 20 KeV, an implantation concentration of $2.8 \times 10^{13}$ ions/cm$^2$ and an implantation angle of 0 or 22 degrees, the second region 536 is implanted with arsenic (As) ions at an implantation energy of 20 KeV, an implantation concentration of $3.2 \times 10^{13}$ ions/cm$^2$ and an implantation angle of 0 or 22 degrees, and the third region 546 is implanted with arsenic (As) ions at an implantation energy of 20 KeV, an implantation concentration of $3.6 \times 10^{13}$ ions/cm$^2$ and an implantation angle of 0 or 22 degrees.

Reviewing results obtained from such partial ion implantation, as shown in FIG. 10b, the concentration of arsenic (As) ions in the third region 546 is relatively high, and the concentration of arsenic (As) ions in the first region 526 is relatively low. In addition, the second region 536 exhibits a gradual decrease in the concentration of arsenic (As) ions from the right to the left. Similarly, in FIG. 10b, "+" means that the concentration of arsenic (As) ions is relatively high, "−" means that the concentration of arsenic (As) ions is relatively low, and "□" means that the concentration of arsenic (As) ions is medium. Such partial ion implantation can be applied to the case in which the removal rate of the target film is higher in the right part of the wafer. Therefore, when the chemical mechanical polishing process, which is a subsequent process, is carried out under such conditions, the degree to which the removal rate is lowered in the third region 546 is greater than the degree to which the removal rate is lowered in the first region 526 and the second region 536, thereby achieving a uniform removal rate throughout the wafer.

Figure 11A:
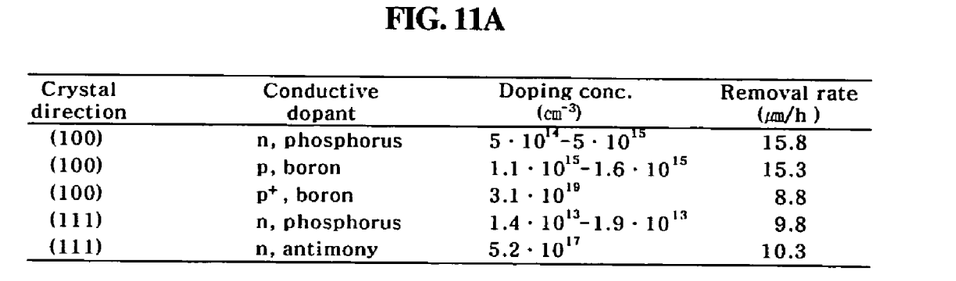
FIGS. 11a and 11b are, respectively, a table and graph showing the removal rate with respect to species of dopants in a polishing step of a flow chart of FIG. 3.
Figure 11B:
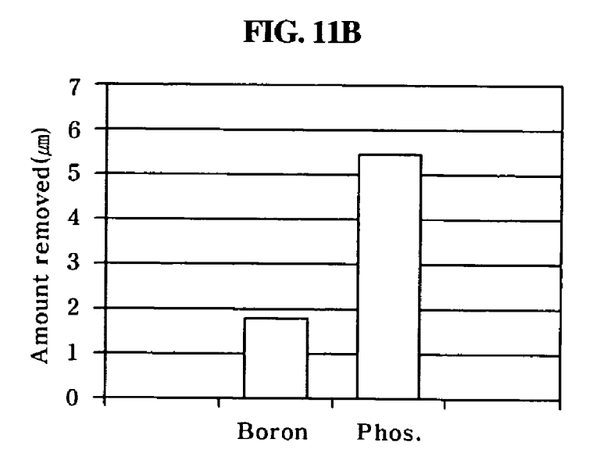

FIGS. 11a and 11b are, respectively, a table and graph showing a removal rate with respect to the species of dopants in a polishing step of a flow chart of FIG. 3.

First, referring to FIG. 11a, as can be seen from the results obtained when a high concentration of phosphorus (P) ions, a low concentration of boron (B) ions, a high concentration of boron (B) ions, a low concentration of phosphorus (P) ions, and antimony (Sb) ions are implanted at implantation concentrations of $5 \times 10^{14}$ to $5 \times 10^{15}$ ions/cm$^2$, $1.1 \times 10^{15}$ to $1.6 \times 10^{15}$ ions/cm$^2$, $3.1 \times 10^{19}$ ions/cm$^2$, $1.4 \times 10^{13}$ to $1.9 \times 10^{13}$ ions/cm$^2$, and $5.2 \times 10^{17}$ ions/cm$^2$, respectively, into silicon substrates having the (100) crystal direction, boron (B) ion implantation at a concentration of $3.1 \times 10^{19}$ ions/cm$^2$ exhibits the lowest removal rate of 8.8 (μm/h). In addition, as shown in FIG. 11b, upon comparing the results obtained from the chemical mechanical polishing process after implantation of boron (B) ions and phosphorus (P) ions, respectively; it can also be seen that implantation of boron (B) ions exhibits a lower removal amount of the target film than implantation of phosphorus (P) ions.

Figure 12:
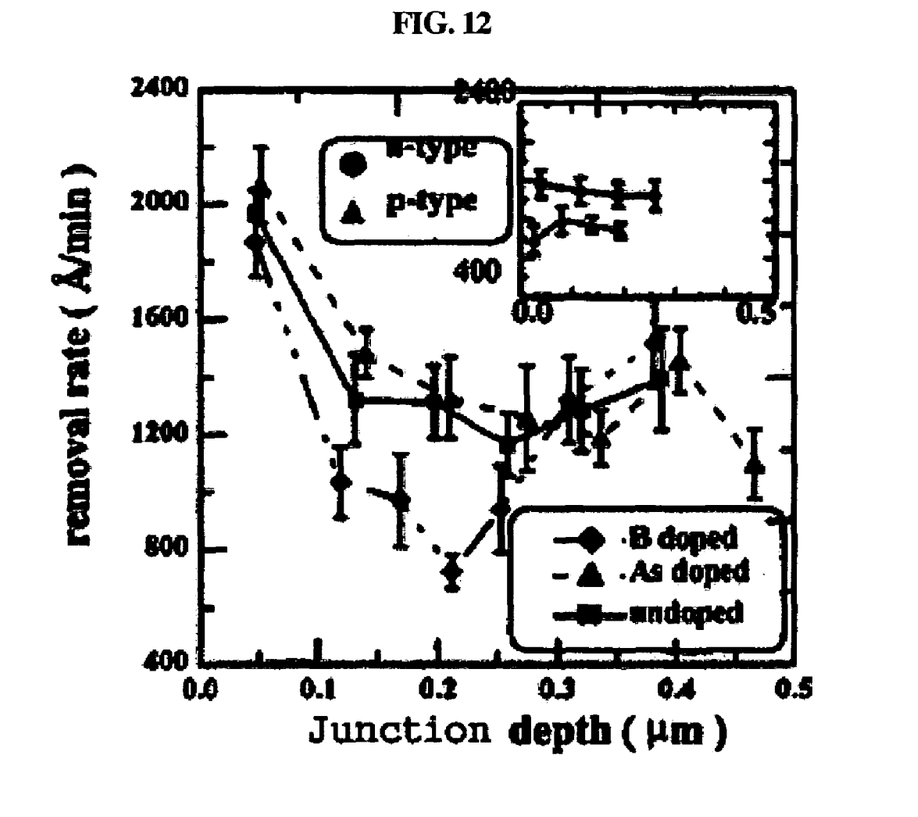
FIG. 12 is a graph showing changes in the removal rate with respect to the depth of a wafer for a variety of dopants in a polishing step of a flow chart of FIG. 3.

FIG. 12 is a graph showing changes in a removal rate with respect to the depth of a wafer for a variety of dopants in a polishing step of a flow chart of FIG. 3. In FIG. 12, the horizontal axis represents a junction depth (μm ) by implanted ions, and the axis of the ordinate represents a removal rate (μm/min) in chemical mechanical polishing.

Referring now to FIG. 12, all exhibit a tendency of decreasing the removal rate until a given junction depth, for example, about 0.2 μm. When the wafer was doped with arsenic (As) ions (see the line represented by reference numeral 610), the highest removal rate was achieved. When the wafer was un-doped (see the line represented by reference numeral 620), the removal rate was lower as compared to arsenic (As) ion-doping. When the wafer was doped with boron (B) ions (see the line represented by reference numeral 630), the lowest removal rate was achieved.

Figure 13:
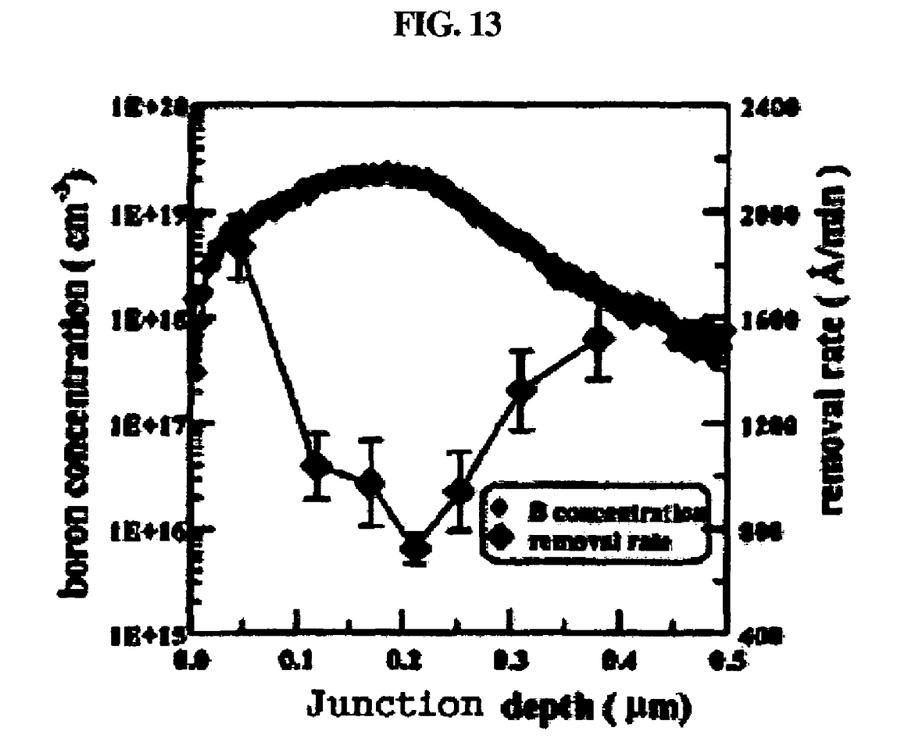
FIG. 13 is a graph showing changes in a boron concentration and a removal rate with respect to a depth of a wafer in a polishing step of a flow chart of FIG. 3.

FIG. 13 is a graph showing changes in a boron concentration and the removal rate with respect to the depth of a wafer in the polishing step of a flow chart of FIG. 3. In FIG. 13, the horizontal axis represents a junction depth (μm) and the left axis of the ordinate represents a boron concentration ($cm^{-3}$) and the right axis of the ordinate represents a removal rate (Å/min).

Referring to FIG. 13, the removal rate in the chemical mechanical polishing process, as shown in the line represented by reference numeral 720, is in inverse proportion to the concentration of boron (B) ions, as shown in the line represented by reference numeral 710. As a result, it can be seen that the removal rate in the chemical mechanical polishing process can be decreased via implantation of boron (B) ions at a relatively high concentration.

As apparent from the above description, in accordance with a chemical mechanical polishing method for manufacturing a semiconductor device of the present invention, partial ion implantation of dopants at different concentrations into respective regions having different removal rates of chemical mechanical polishing for the target film is first carried out, followed by the chemical mechanical polishing process. Thereby, advantages, such as the capability to perform the chemical mechanical polishing process at a uniform removal rate throughout the wafer, by which the removal rate is decreased in high-removal rate regions and the removal rate is increased in low-removal rate regions, are provided.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A chemical mechanical polishing method for manufacturing a semiconductor device, comprising:
   performing partial ion implantation of dopants at different concentrations into a plurality of at least two divided regions of a wafer having a polysilicon planarization-target film; and
   subjecting the partially ion implanted-wafer to a chemical mechanical polishing process;
   wherein the partial ion implantation step is carried out in a manner where a relatively high concentration of the dopants is implanted into the region having a high removal rate of the polysilicon planarization-target film, so as to decrease the removal rate, and a relatively low concentration of the dopants is implanted into the region having a low removal rate of the polysilicon planarization-target film, so as to increase the removal rate.

2. The method according to claim 1, wherein the dopants are boron ions.

3. The method according to claim 2, wherein implantation of boron ions is carried out within the concentration of $1\times10^{11}$ to $5\times10^{15}$ ions/$cm^3$ and within the implantation energy of 10 KeV to 500 KeV.

4. The method according to claim 1, wherein the partial ion Implantation step includes:
   analyzing distribution of a removal rate of the target film by the chemical mechanical polishing process in the wafer;
   establishing a plurality of at least two regions of a wafer divided according to the distribution of the removal rate, based on the analysis results; and
   performing partial ion implantation to implant different concentrations of dopants into each of the established plural regions.

* * * * *